US006563136B2

(12) United States Patent
Kunii (10) Patent No.: US 6,563,136 B2
(45) Date of Patent: May 13, 2003

(54) THIN-FILM SEMICONDUCTOR DEVICE HAVING A THIN-FILM TRANSISTOR FOR CIRCUITS THAT DIFFERS FROM A THIN-FILM TRANSISTOR FOR PIXELS (75) Inventor: Masafumi Kunii, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/921,532

(22) Filed: Aug. 3, 2001

(65) Prior Publication Data

US 2002/0068372 A1 Jun. 6, 2002

(30) Foreign Application Priority Data

Aug. 10, 2000 (JP) ........................................ 2000-241984

(51) Int. Cl.$^7$ .............................................. H01L 29/04
(52) U.S. Cl. .............................. 257/72; 257/59; 257/61; 257/408; 438/163
(58) Field of Search ............................. 257/57, 59, 61, 257/66, 72, 408; 438/151, 163

(56) References Cited

U.S. PATENT DOCUMENTS

| 5,266,507 A | * | 11/1993 | Wu .............................. 438/154 |
| 5,323,042 A | * | 6/1994 | Matsumoto .................. 257/350 |
| 5,508,209 A | * | 4/1996 | Zhang et al. ................ 438/162 |
| 5,576,556 A | * | 11/1996 | Takemura et al. ............ 257/69 |
| 5,608,251 A | * | 3/1997 | Konuma et al. ............. 257/337 |
| 5,620,905 A | * | 4/1997 | Konuma et al. ............. 438/163 |
| 5,739,549 A | * | 4/1998 | Takemura et al. ............. 257/59 |
| 5,789,762 A | * | 8/1998 | Koyama et al. ............... 257/66 |
| 5,904,514 A | * | 5/1999 | Konuma et al. ............. 438/165 |
| 5,998,841 A | * | 12/1999 | Suzawa ....................... 257/350 |
| 6,078,060 A | * | 6/2000 | Shibuya et al. ............... 257/66 |
| 6,166,414 A | * | 12/2000 | Miyazaki et al. ........... 257/369 |
| 6,214,652 B1 | * | 4/2001 | Batra et al. ................. 438/149 |
| 6,255,705 B1 | * | 7/2001 | Zhang et al. ................ 257/412 |
| 6,300,659 B1 | * | 10/2001 | Zhang et al. ................ 257/347 |
| 6,310,362 B1 | * | 10/2001 | Takemura ..................... 257/59 |
| 6,346,730 B1 | * | 2/2002 | Kitakado et al. ............ 257/350 |

* cited by examiner

Primary Examiner—George Eckert
(74) Attorney, Agent, or Firm—Sonnenschein, Nath & Rosenthal (57) ABSTRACT A thin-film semiconductor device which has a pixel array section and a peripheral circuit section arranged around it, said pixel array section containing pixel electrodes and thin-film transistors for pixels which switch the pixel electrodes, said peripheral circuit section containing driving circuits each having thin-film transistors for circuits which drive the thin-film transistors for pixels, said each thin-film transistor having the laminate structure having a semiconductor thin film, a gate electrode, and a gate insulating film interposed between them, and said semiconductor thin film having a channel region inside the end of the gate electrode, a lightly doped region outside said channel region, a heavily doped region outside said lightly doped region, and a concentration boundary which separates said lightly doped region and heavily doped region from each other, wherein said concentration boundary measured from the end of said gate electrode is positioned more inside in said thin-film transistor for circuits than in said thin-film transistor for pixels.

8 Claims, 10 Drawing Sheets

THIN-FILM SEMICONDUCTOR DEVICE HAVING A THIN-FILM TRANSISTOR FOR CIRCUITS THAT DIFFERS FROM A THIN-FILM TRANSISTOR FOR PIXELS

RELATED APPLICATION DATA

The present application claims priority to Japanese Application No. P2000-241984 filed Aug. 10, 2000, which application is incorporated herein by reference to the extent permitted by law.

BACKGROUND OF THE INVENTION

The present invention relates to a thin-film semiconductor device formed by integrating thin-film transistors. More particularly, the present invention relates to a thin-film semiconductor device which has a pixel array section and a peripheral circuit section arranged thereabout and which is used as a driving substrate for a liquid-crystal display unit of active matrix type.

A liquid-crystal display unit of active matrix type usually has thin-film transistors as switching elements. In thin-film transistors, the semiconductor thin film that functions as the active layer is conventionally made of polycrystalline silicon. Thin-film transistors of polycrystalline silicon are used not only for switching elements but also for circuit elements. Combinations of switching elements and circuit elements form peripheral driving circuits on one substrate. In addition, thin-film transistors of polycrystalline silicon can be made extremely small. Therefore, each switching element occupies only a small area in each pixel, and this leads to a large aperture ratio of pixel. Liquid crystal display units of active matrix type are small in size and capable of high definition display, and they are suitable for monitors of video camcorders and digital cameras and portable telephone terminals.

Unfortunately, conventional thin-film transistors of polycrystalline silicon need a comparatively high driving voltage of about 9–15 V. This leads to an increased power consumption of liquid crystal display which is not desirable for portable telephones and any other portable devices from the standpoint of power saving. If a liquid crystal display of active matrix type is to work with a low power consumption, it is necessary that thin-film transistors of polycrystalline silicon work at a low driving voltage. This requires thin-film transistors of polycrystalline silicon, particularly those for peripheral driving circuits, to work with a large current at a low voltage.

On the other hand, thin-film transistors of polycrystalline silicon suffer another disadvantage when they are formed on a glass substrate having a glass transition point of about 600–700° C., by so-called low-temperature process. The disadvantage is that the breakdown voltage is low due to hot carriers, particularly in the case of n-channel type transistors. One way to prevent deterioration by hot carriers is to form an LDD region (lightly doped drain region) at the drain end (at least) of thin-film transistors. The LDD region alleviates the concentration of electric field at the drain end. However, the LDD region formed at the drain end inevitably lowers the on-state current of the thin-film transistor. This is a hindrance to realizing thin-film transistors that work with a large current at a low driving voltage, thereby saving power consumption.

There has been disclosed in Japanese Patent Laid-open No. 45930/1997 a new thin-film transistor which is so constructed as to meet both requirements for preventing deterioration by hot carriers and for increasing on-stage current. The disclosed structure is characterized in that part of the LDD region overlaps with part of the electrode. However, nothing is disclosed about how the relative position of the LDD region and the gate electrode affects the operating characteristics of the thin-film transistor.

A liquid crystal display of active matrix type in which the pixel array section and the peripheral circuit section are formed on one substrate requires that the thin-film transistors for the peripheral driving circuit usually have a high on-state current. It also requires that the thin-film transistors formed in the pixel array section for switching pixel electrodes have a low leakage current (off-state current). It is natural that the thin-film transistor for circuits and the thin-film transistor for pixels differ from each other in characteristic properties required. Technologies to cope with this situation have been disclosed in Japanese Patent Laid-open Nos. 88972/1994 and 189998/1998 and WO98/13911. However, they are not satisfactory from the practical point of view.

SUMMARY OF THE INVENTION

In view of the foregoing, the present invention was completed by improving the structure of integrated thin-film transistors used for thin-film semiconductor device such as liquid crystal display of active matrix type. It is an object of the present invention to provide a thin-film semiconductor device suitable for high-quality image display with low power consumption. The thin-film semiconductor device consists of thin-film transistors for circuits that work with a low driving voltage and thin-film transistors for pixels that work with a small leakage current, both types of thin-film transistors being integrated on one substrate. The present invention is directed to a thin-film semiconductor device which has a pixel array section and a peripheral circuit section arranged around it, said pixel array section containing pixel electrodes and thin-film transistors for pixels which switch the pixel electrodes, said peripheral circuit section containing driving circuits each consisting of thin-film transistors for circuits which drive the thin-film transistors for pixels, said each thin-film transistor having the laminate structure consisting of a semiconductor thin film, a gate electrode, and a gate insulating film interposed between them, and said semiconductor thin film having a channel region -inside the end of the gate electrode, a lightly doped region outside said channel region, a heavily doped region outside said lightly doped region, and a concentration boundary which separates said lightly doped region and heavily doped region from each other, wherein said concentration boundary measured from the end of said gate electrode is positioned more inside in said thin-film transistor for circuits than in said thin-film transistor for pixels.

According to a preferred embodiment, the concentration boundary of the thin-film transistor for circuits is positioned inside the end of the gate electrode and the concentration boundary of the thin-film transistor for pixels is positioned outside the end of the gate electrode; or the concentration boundary of the thin-film transistor for circuits is positioned outside as much as a first distance from the end of the gate electrode and the concentration boundary of the thin-film transistor for pixels is positioned outside as much as a second distance from the end of the gate electrode, with the first distance being shorter than the second distance.

According to another preferred embodiment, the thin-film transistor for circuits has a lightly doped region at the drain side but does not have a lightly doped region at the source side. More preferably, each thin-film transistor has the laminate structure of bottom gate type in which the semiconductor thin film is placed on the gate electrode with a gate insulating film interposed between them.

The present invention has the following features. The concentration boundary measured from the end of the gate electrode is positioned more inside in the thin-film transistor for circuits than in the thin-film transistor for pixels. The concentration boundary separating the lightly doped region (LDD region) and the heavily doped region (drain region and source region) from each other increases on-state current as it moves toward inside from the end of the gate electrode and decreases leakage current as it moves toward outside from the end of the gate electrode. This was found by the present inventors. Adjusting the position of the concentration boundary relative to the end of the gate electrode optimizes the operating characteristics of the thin-film transistor for circuits and the thin-film transistor for pixels. The result is a reduction of power consumption in the peripheral circuit section without the pixel array section losing image quality.

DESCRIPTION OF THE PREFERRE EMBODIMENTS

Figure 1:
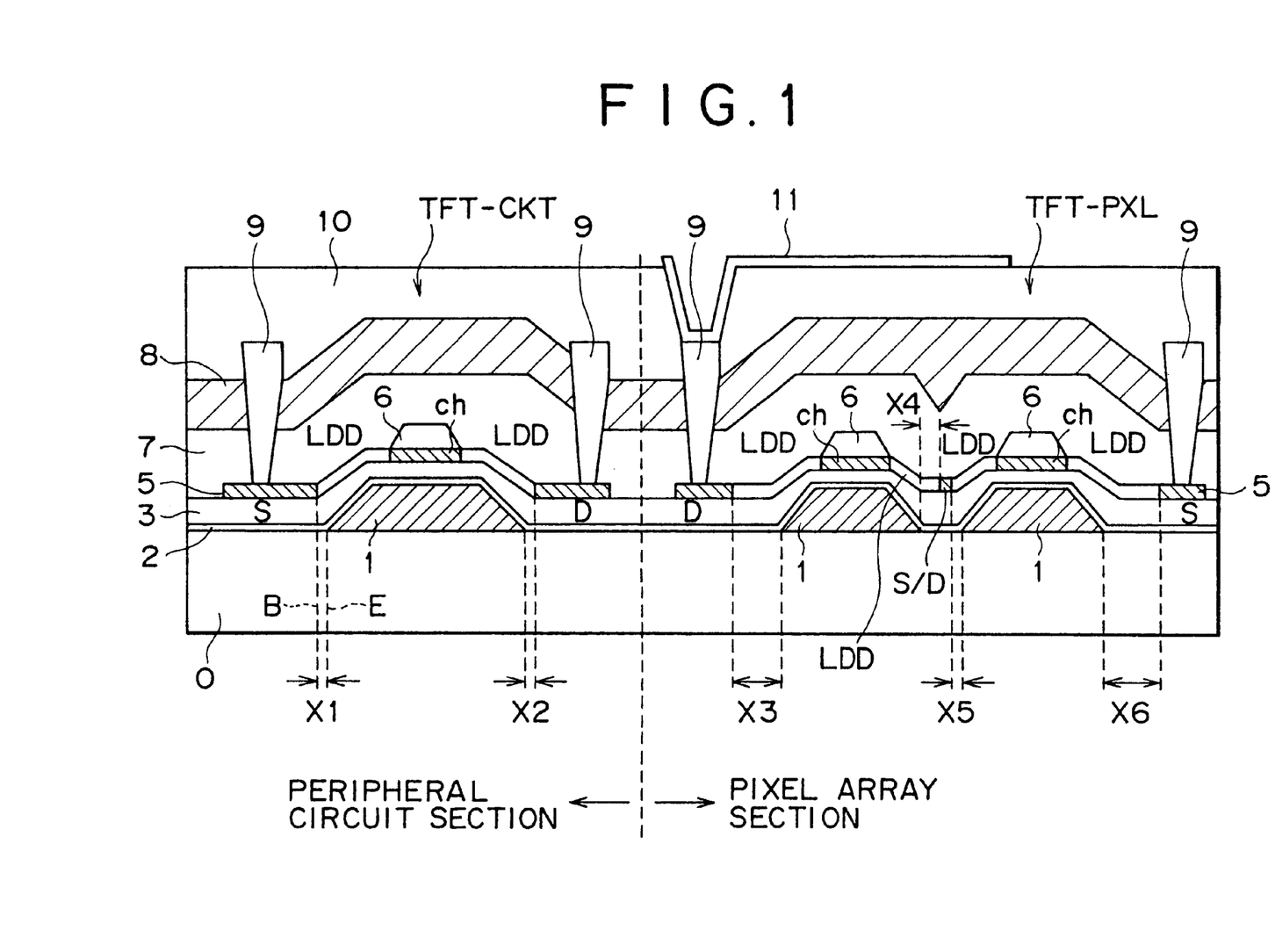
FIG. 1 is a partial sectional view showing the first embodiment of the thin-film semiconductor device according to the present invention.

The embodiments of the present invention will be described below in detail with reference to the accompanying drawings. FIG. 1 is a schematic partial sectional view showing the first embodiment of the thin-film semiconductor device pertaining to the present invention. This semiconductor device consists of a pixel array section and a peripheral circuit section arranged around it. The pixel array section contains a pixel electrode 11 and a thin-film transistor (TFT-PXL) for pixel switching. In this embodiment, the TFT-PXL has the bottom-gate structure of dual gate type and is of n-channel type. On the other hand, the peripheral circuit section contains a driving circuit consisting of thin-film transistor (TFT-CKT) for the circuit. This driving circuit drives the thin-film transistor TFT-PXL for pixels.

FIG. 1 shows only one TFT-CKT of n-channel type which has the bottom gate structure of single-gate type. Each thin-film transistor TFT-PXL and TFT-CKT has the laminate structure consisting of a semiconductor thin film 5 and a gate electrode 1, with gate insulating films (2, 3) interposed between them. The semiconductor thin film 5 is formed from polycrystalline silicon. The gate insulating film has the laminate structure consisting of a gate nitride film 2 and a gate oxide film 3. Incidentally, these thin-film transistors TFT-PXL and TFT-CKT are formed by integration on an insulating substrate 0 such as glass.

The semiconductor thin film 5 is patterned in conformity with the element region of each thin-film transistor. The patterned semiconductor thin film 5 has a channel region (ch) which is positioned inside the ends (E) of the gate electrode 1, lightly doped regions (LDD regions) which extend outside from the channel region (ch), heavily doped regions (source region S and drain region D) which extend outside from the LDD regions, and a concentration boundary B which separates the lightly doped region from the heavily doped region. Incidentally, the channel region (ch) of each thin-film transistor is protected with a stopper film 6. The thin-film transistors TFT-PXL and TFT-CKT constructed as mentioned above are covered with an interlayer insulating film 7 and a protective film 8. On the protective film 8 is formed a wiring electrode 9. Each wiring electrode 9 is electrically connected to the source region S and drain region D of each thin-film transistor through a contact hole which opens in the interlayer insulating film 7 and the protective film 8. The wiring electrode 9 is covered with a planarizing film 10. On the planarizing film 10 is formed a pixel electrode 11 in conformity with a prescribed pattern.

The present invention is characterized in that the thin-film transistor TFT-CKT for circuits differs from the thin-film transistor TFT-PXL for pixels in that the position X of the concentration boundary B measured from the end E of the gate electrode is more inside in the former than in the latter. In other words, thin-film transistors are formed by integration in such a way that the relation of X1, X2<X3, X4, X5, X6 is satisfied. In FIG. 1, the thin-film transistors on the left represents the n-channel TFT-CKT for the peripheral circuit section and the thin-film transistor on the right represents the multigate-type TFT-PXL for pixels in which the two gate electrodes 1 have a common potential. In FIG. 1, the p-channel TFT-CKT for the peripheral circuit section is not shown. In each thin-film transistor, the distance between the end E of the gate electrode and the concentration boundary B (referred to as the LDD end) is represented by X1, X2, X3, X4, X5, and X6, from left to right as shown in FIG. 1. X1 and X2 each denotes the distance between the gate end E and the LDD end B in the TFT-CKT, and X3 to X6 each denotes the distance between the gate end E and the LDD end B in the TFT-PXL. The TFT-CKT is required to have a high on-state current, whereas the TFT-PXL is required to have a low leakage current. These requirements are met when the relation of 0<X1, X2<X3, X4, X5, X6 is satisfied, where the distance is measured from the gate end E. Distances toward the inside and outside of the gate electrode 1 are taken as negative and positive, respectively.

Figure 2:
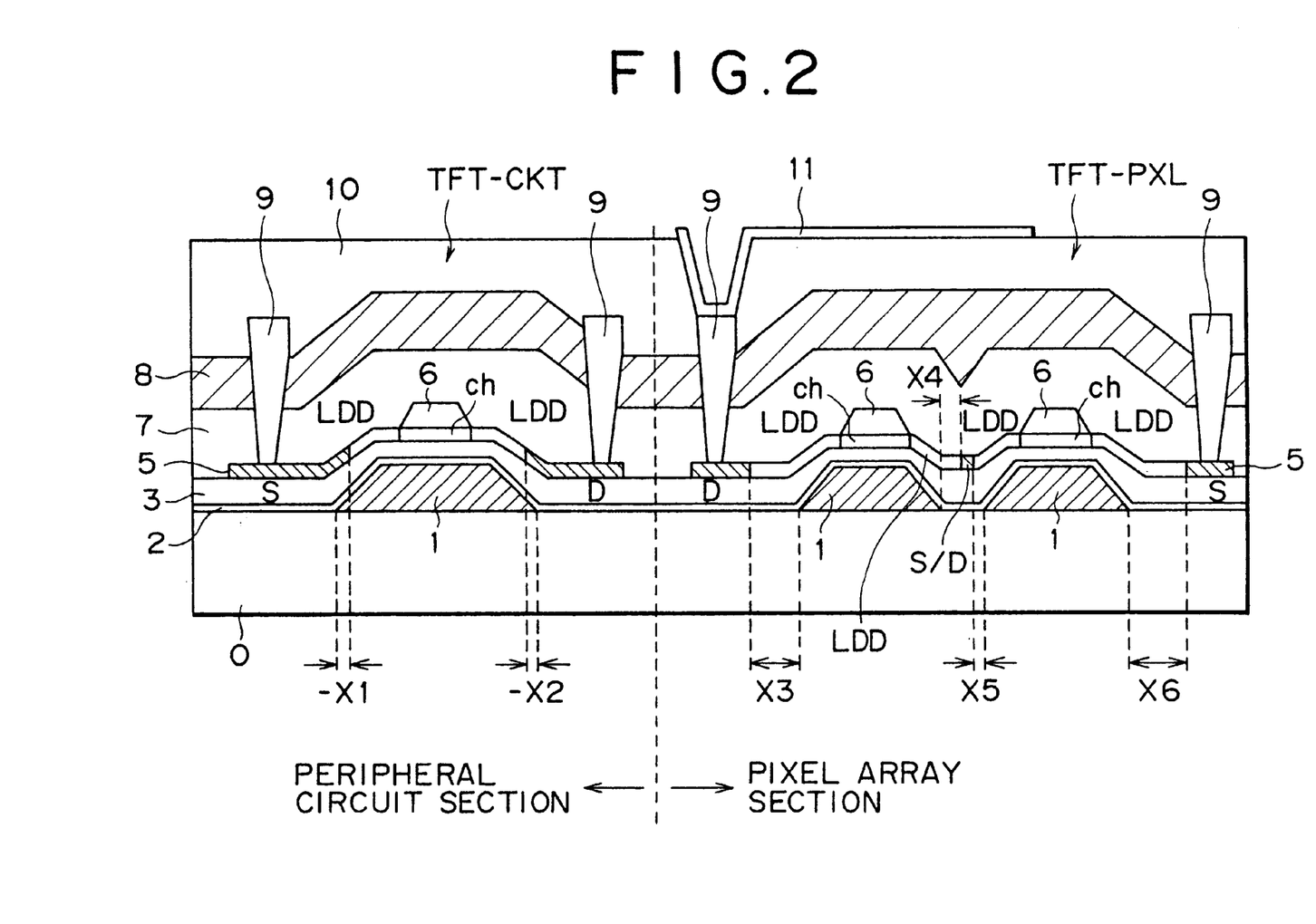
FIG. 2 is a partial sectional view showing the second embodiment.

FIG. 2 is a schematic partial sectional view showing the second embodiment of the thin-film semiconductor device pertaining to the present invention. The reference numerals in FIG. 1 are used in FIG. 2 for corresponding parts. This embodiment is characterized in that the thin-film transistor TFT-CKT for circuits has the concentration boundary B which is inside the end E of the gate electrode 1 and the thin-film transistor TFT-PXL for pixels has the concentration boundary B which is outside the end E of each gate electrode 1. In other words, there is a relation of X1, X2<0<X3, X4, X5, X6. This relation differs from that in the first embodiment mentioned above. That is, the LDD end of the TFT-CKT is more outside from the end of the gate electrode by the first distance, and the LDD end of the TFT-PXL is more outside from the end of the gate electrode by the second distance. In other words, in both TFT-CKT and TFT-PXL, the LDD end is outside the end of the gate electrode. The first distance is shorter than the second distance.

Figure 3:
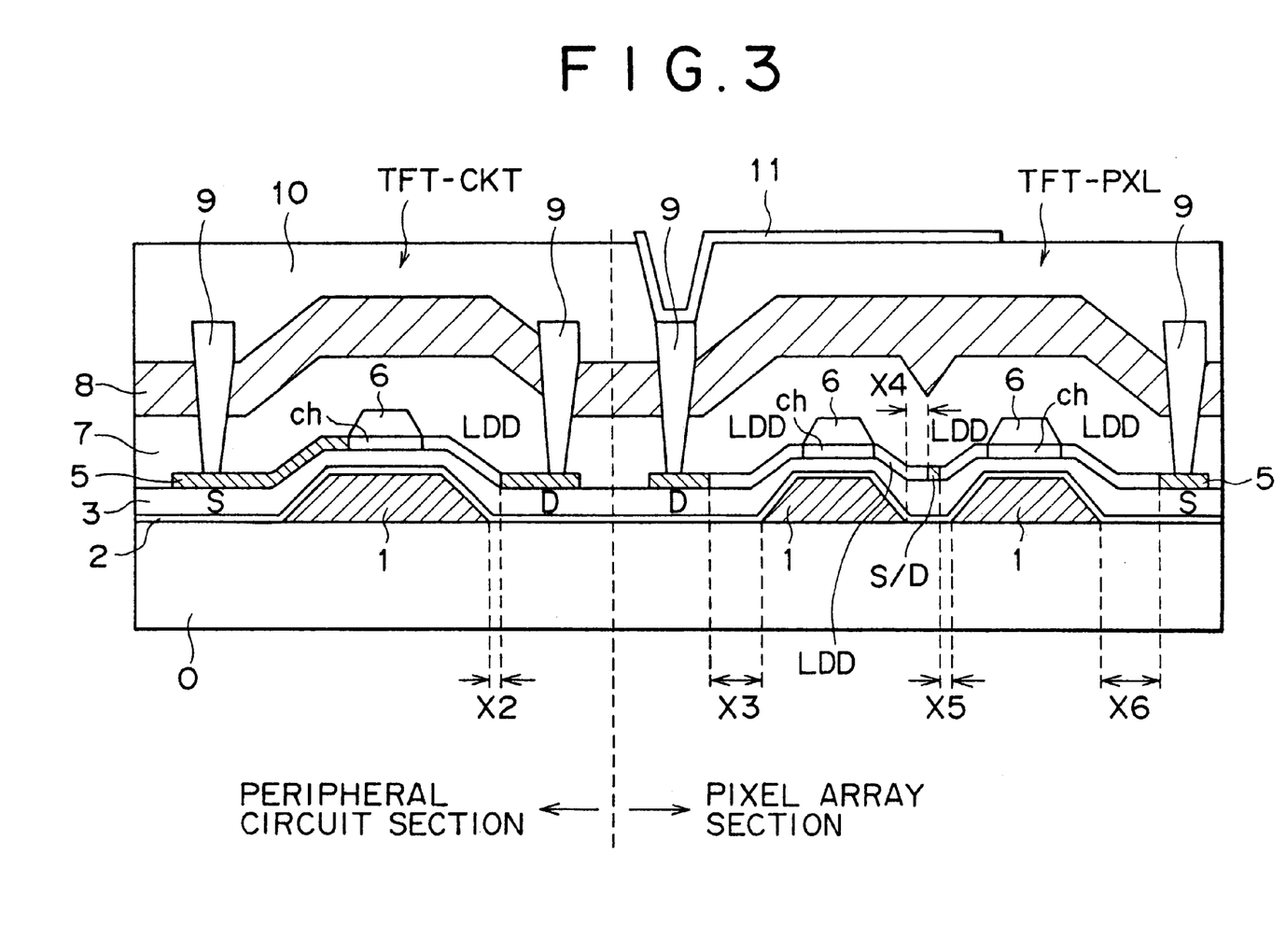
FIG. 3 is a partial sectional view showing the third embodiment.

FIG. 3 is a schematic partial sectional view showing the third embodiment of the thin-film semiconductor device pertaining to the present invention. The reference numerals in FIGS. 1 and 2 are used in FIG. 3 for corresponding parts. This embodiment is characterized in that the TFT-CKT has the lightly doped region (LDD region) on the drain side D but does not have the lightly doped region (LDD region) on the source side S. The TFT-CKT of such asymmetrical structure can be used for that part of circuits in which on-state current flows in a fixed direction at all times. In other words, the LDD region alleviates field concentration when the drain is fixed and the absence of LDD region permits a large amount of on-state current to be taken from the source region. In the third embodiment, too, the relation of X2<X3, X4, X5, X6 is satisfied, so that the TFT-CKT has a high on-state current and the TFT-PXL suppresses a low leakage current.

Figure 4:
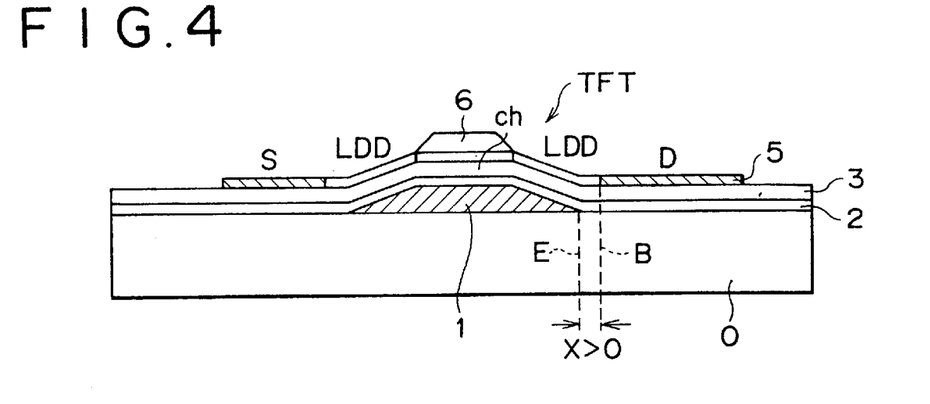
FIG. 4 is a schematic diagram showing one example of the LDD structure.
Figure 5:
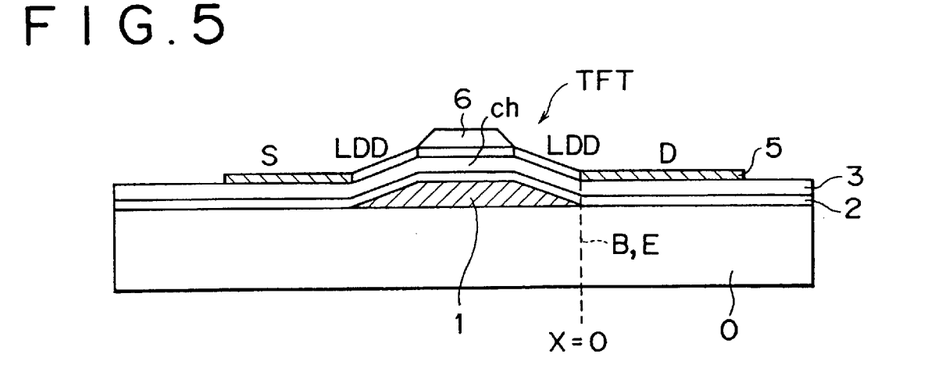
FIG. 5 is a schematic diagram showing another example of the LDD structure.
Figure 6:
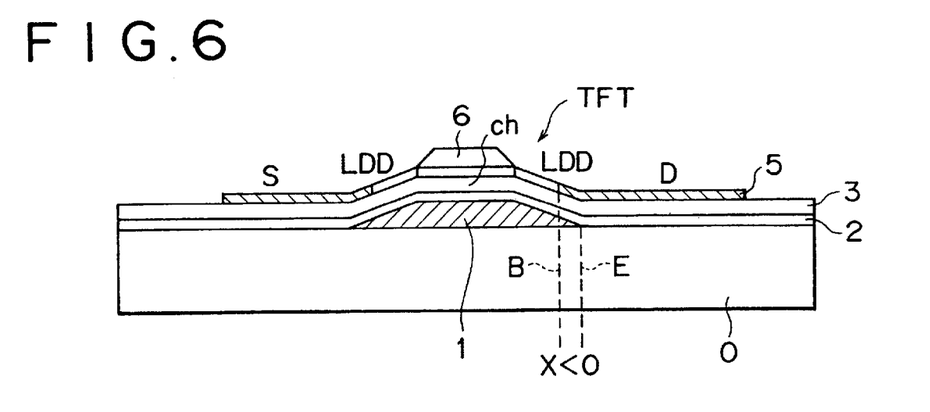
FIG. 6 is a schematic diagram showing further another example of the LDD structure.
Figure 7:
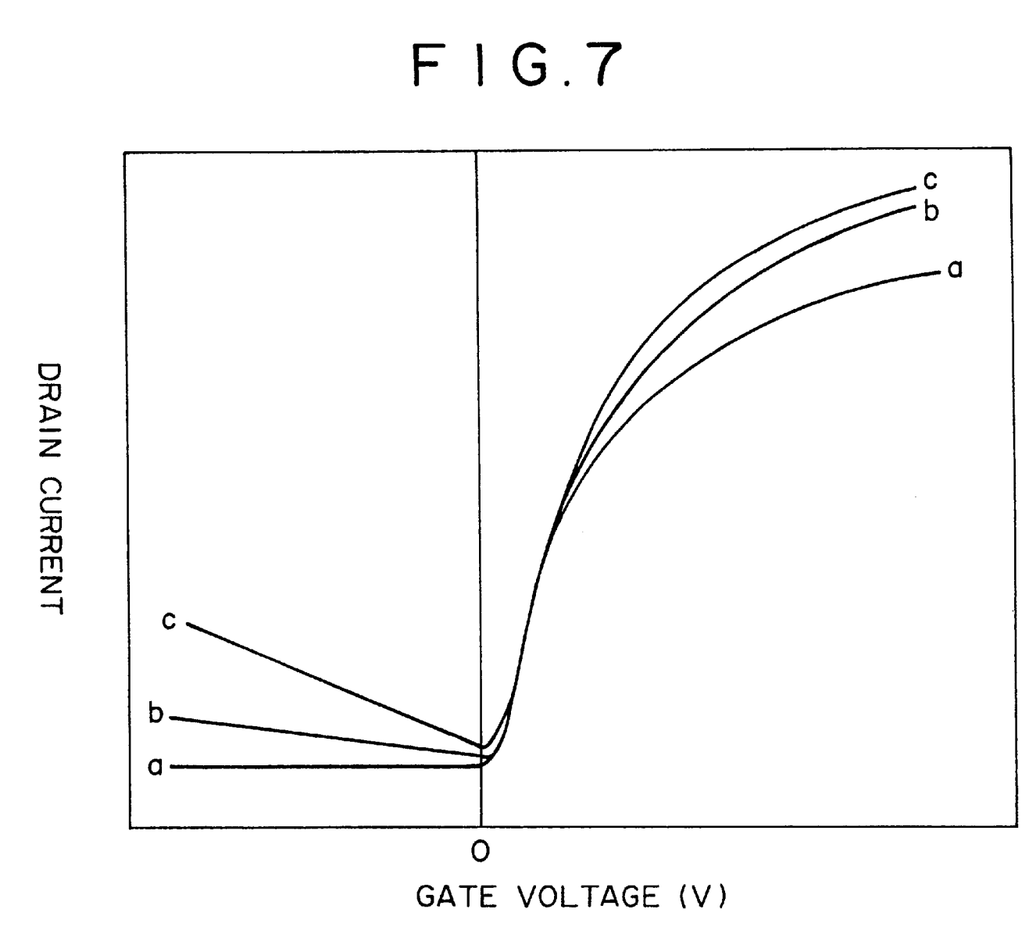
FIG. 7 is a graph showing the drain current/gate voltage characteristics of the thin-film transistor having the LDD structure shown in FIGS. 4 to 6.

The following is a theoretical explanation of the present invention which refers to FIGS. 4 to 7. FIGS. 4 to 6 show the LDD structure of the thin-film transistor. FIG. 7 shows the drain current/gate voltage characteristics of the thin-film transistor corresponding to each LDD structure shown in FIGS. 4 to 6. In FIGS. 4 to 6, the distance X is defined as X=(LDD end B)–(gate end E), where both positions B and E are measured from the gate end E as the origin (0) of the coordinate. Distance measured toward outside of the gate end E is taken as positive and distance measured toward inside of the gate end E is taken as negative. In the LDD structure shown in FIG. 4, X>0 because the end B of the LDD region along the lengthwise direction of the channel region (ch) is outside the gate end E. This LDD structure has the drain current/gate voltage characteristics as represented by curve "a" in FIG. 7. When the gate voltage is negative, the following occurs. In the part where the gate electrode overlaps with the LDD region, the LDD region is influenced by the gate field and an inversion layer is formed. The LDD region outside the gate end keeps a high resistance because it is not influenced by the gate field and hence the electric field at the gate end is kept low. Therefore, the LDD structure shown in FIG. 4 functions in such a way that the leakage current is sufficiently low in its off region and the on-state current decreases because of the high LDD resistance. Thus, the LDD structure shown in FIG. 4 is suitable for thin-film transistors for pixels.

By contrast, in the LDD structure shown in FIG. 6, X<0 because the LDD end B is inside the gate end E. This LDD structure has the characteristic curve "c" in FIG. 7. Since the LDD region overlaps completely with the gate electrode, the LDD region as a whole constitutes an inversion layer when the gate voltage is negative. Consequently, the band at the drain end is greatly bent and the electric field concentrates more at the drain end. The result is that as the gate bias is increased in the negative direction, the leakage current due to tunnel current increases. On the other hand, in the saturated current region where the gate bias is positive an accumulation layer is formed owing to modulation, with the result that on-state current increases without contribution from the LDD resistance. Hot carriers occur only in the sub-threshold region which corresponds to the region where the gate bias is shallow. Therefore, LDD hardly undergoes modulation in the region where hot carriers occur. Thus, the LDD region sufficiently contributes to alleviating the electric field at the drain end. In other words, the LDD structure shown in FIG. 6 is capable of increasing the on-state current in the saturation region while suppressing the occurrence of hot carriers. Thus this LDD structure is suitable for thin-film transistors for a peripheral circuit section.

FIG. 5 shows another LDD structure in which the gate end E coincides with the LDD end B and hence X=0. The thin-film transistor corresponding to this LDD structure has the drain current/gate voltage characteristics as denoted by the curve "b" in FIG. 7. In this structure, current in the saturation region increases more than that in the structure shown in FIG. 4; it rather resembles that in the structure shown in FIG. 6. Leakage current in this structure is an intermediate between that in the structure shown in FIG. 4 and that in the structure shown in FIG. 6.

Figure 8A:
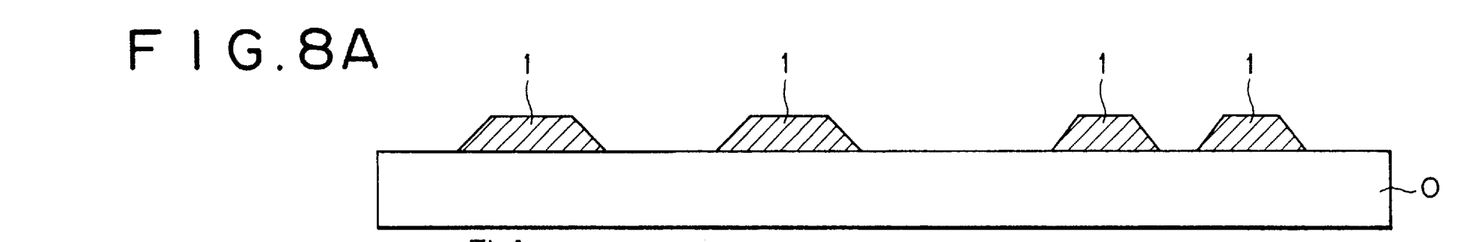
FIGS. 8A to 8H are diagrams showing the steps of producing the thin-film semiconductor device according to the present invention.

A concrete explanation is made below with reference to FIGS. 8A to 8H of one embodiment of the process for producing the thin-film semiconductor device according to the present invention. This embodiment is concerned with integration of thin-film transistors of bottom gate type on a glass substrate 0 by the low-temperature process. The figures show two thin-film transistors of multi-gate structure for pixels in the right half and two thin-film transistors for circuits in the left half. One is of n-channel type and the other is of p-channel type. As shown in FIG. 8A, the process starts with forming a 30–300 nm thick film of high-melting metal such as Mo, Ti, Ta, and W on an insulating substrate 0. The metal film undergoes patterning so that the gate electrode 1 is formed.

Figure 8B:
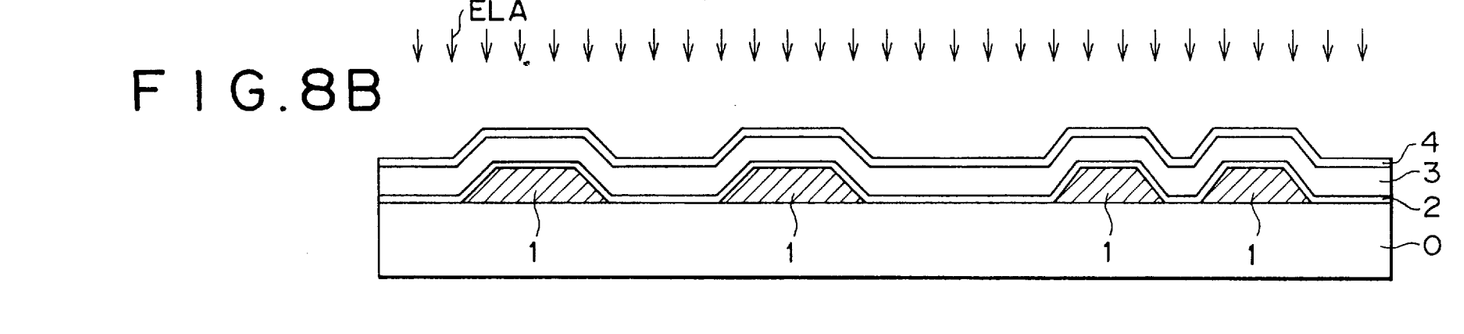

Then, a 50-nm thick film 2 of silicon nitride ($SiN_x$) for the gate is formed by plasma CVD, atmospheric CVD, reduced pressure CVD, or the like, as shown in FIG. 8B. On this film is continuously formed an approximately 100-nm thick film 3 of silicon oxide ($SiO_2$) for the gate. On this film is continuously formed an approximately 30–80 nm thick semiconductor film 4 of amorphous silicon. This step is followed by annealing at 400–450° C. for about one hour in a nitrogen atmosphere or vacuum for elimination of hydrogen from the film in the case where the process employs the plasma CVD. After this annealing step, the amorphous silicon is converted into polycrystalline silicon by excimer laser annealing (ELA). Excimer laser annealing consists in irradiating amorphous silicon with an excimer laser beam, thereby converting it into polycrystalline silicon in the course of cooling from a melt.

Figure 8C:
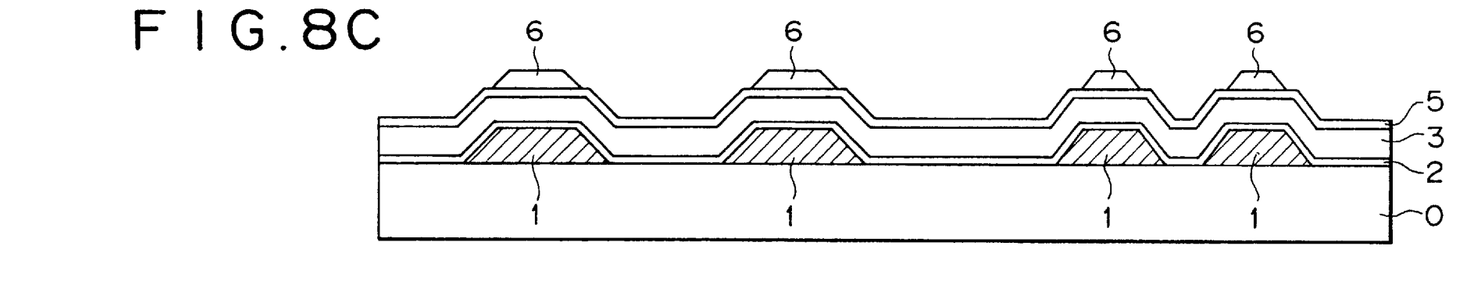

Then, an approximately 100–300 nm thick film of $SiO_2$ is formed as shown in FIG. 8C. This film undergoes patterning by back surface exposure, so that the stopper film 6 is formed. This patterning is accomplished by applying a photoresist to the $SiO_2$ film and exposing the photoresist film with light passing through the substrate 0 by using the gate electrode 1 as a mask, so that a pattern conforming to the gate electrode 1 is formed in the photoresist film. Etching is performed on the underlying $SiO_2$ film by using as a mask the pattern formed in the photoresist film. In this way there is formed the stopper film 6 which aligns with the gate electrode 1.

Figure 8D:
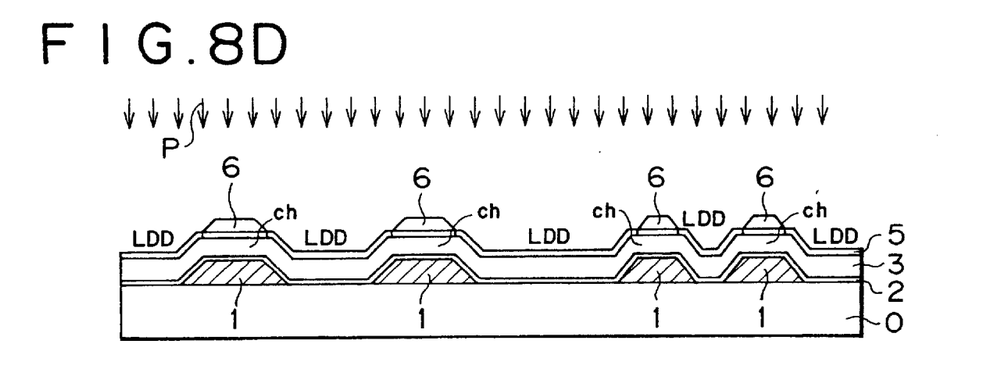

In the step shown in FIG. 8D, phosphorus (P) ion implantation for comparatively light doping is carried out by using the stopper film 6 as a mask, so that the LDD region is formed. This ion implantation is performed on the entire surface of the substrate 0. Therefore, the semiconductor film 5, except for the part which is not covered with the stopper film 6, becomes the lightly-doped region, and the part covered with the stopper film 6 remains as the channel region (ch). The ion implantation for LDD is carried out at an accelerating voltage of 5–10 keV and a dose of $5\times10^{12}$ to $1.5\times10^{13}$/cm$^2$.

Figure 8E:
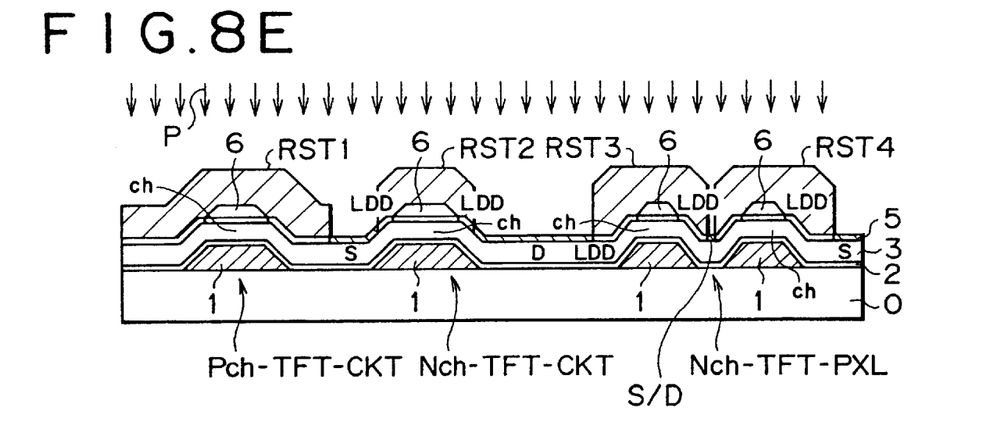

In the step shown in FIG. 8E, ion implantation is carried out to form an n-channel TFT in the following manner. The part which becomes Pch-TFT-CKT is covered with a resist mask RST1, and the parts which become Nch-TFT-CKT and Nch-TFT-PXL are covered with resist masks RST2, RST3, and RST4. Phosphorus (P) ion implantation for heavy doping is carried out through these resist masks RST1 to RST4, so as to form the source region S and drain region D for Nch-TFT. In this embodiment, the phosphorus ion implantation into the polycrystalline semiconductor film 5 was carried out at an accelerating voltage of 10 keV and a dose of $1\times10^{15}$/cm$^2$. As shown in the figure, the LDD region is eventually formed in those parts which are covered with the resist masks RST2, RST3, and RST4. In this embodiment, the resist masks RST are patterned such that the LDD region of Nch-TFT-CKT is inside the gate electrode 1 and the LDD region of Nch-TFT-PXL is outside the gate electrode 1. As mentioned above, the thin-film transistor of bottom gate type makes it possible to easily establish an optimum LDD length between the thin-film transistor for circuits and the thin-film transistor for pixels by means of the resist pattern used to form the source and drain.

Figure 8F:
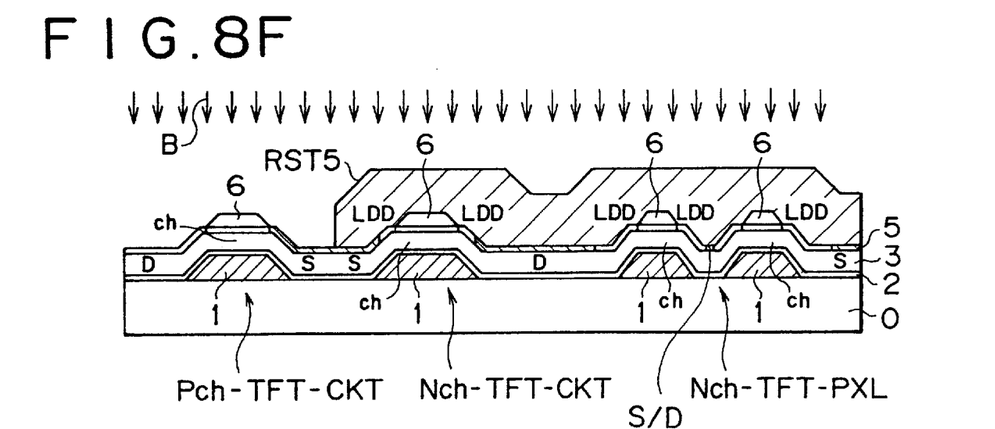

In the step shown in FIG. 8F, the resist masks RST1 to RST4, which have been used, are removed, and a new resist mask RST5 is formed for the p-channel thin-film transistor. This resist mask covers Nch-TFT-CKT and Nch-TFT-PXL. The polycrystalline semiconductor thin film 5 masked with RST5 undergoes boron (B) ion implantation at an accelerating voltage of 10 keV and a dose of about $1\times10^{15}$/cm$^2$. In this way the source region S and drain region D are formed. Unlike Nch-TFT-CKT, Pch-TFT-CKT is not provided with the LDD region. In general, an n-channel thin-film transistor essentially needs the LDD structure to alleviate the concentration of electric field at the drain end, whereas a p-channel thin-film transistor does not necessarily need the LDD region. Needless to say, a p-channel thin-film transistor may have the LDD region. The TFT-PXL may be that of p-channel type instead of that of n-channel type which is shown. In this case, too, the LDD region should preferably be short in the thin-film transistor for circuits and long in the thin-film transistor for pixels.

Figure 8G:
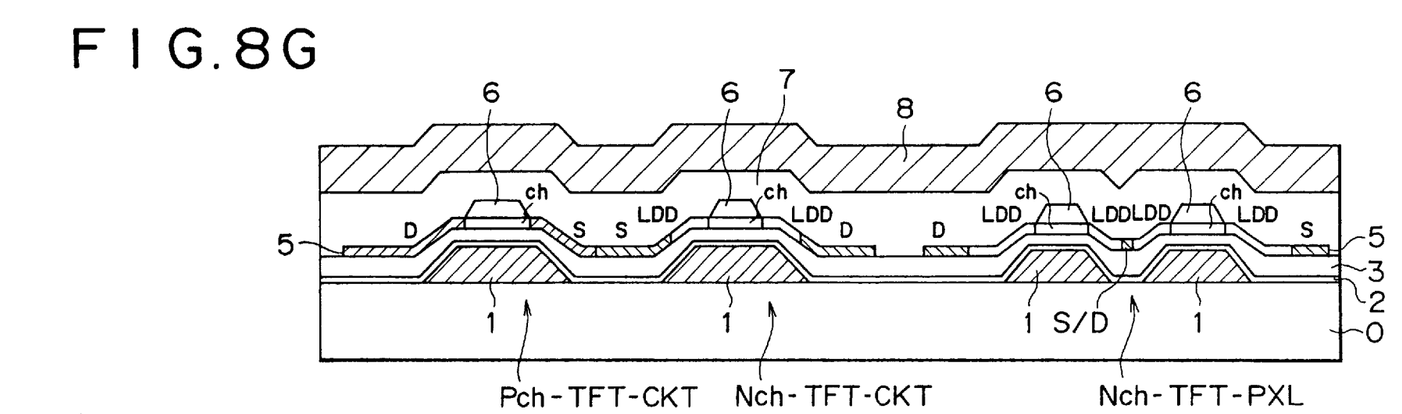

In the step shown in FIG. 8G, the resist mask RST5 which has been used is removed, and the impurity which has been implanted into the semiconductor thin film 5 is activated by ELA, RTA (rapid thermal annealing), or furnace annealing. The semiconductor film 5 undergoes etching, so that the region for each thin-film transistor is formed. This etching is carried out so as to eliminate unnecessary part of $SiO_2$ constituting the stopper film 6. An interlayer insulating film 7 of $SiO_2$ (100–200 nm thick) is formed on the semiconductor thin film 5 and the stopper film 6. A protective film 8 of $SiN_x$ (100–200 nm thick) is continuously formed. The substrate 0 is annealed at 350–400° C. for 2 hours in a nitrogen atmosphere, so that the hydrogen contained in the protective film 8 and the interlayer insulating film 7 is introduced into the semiconductor film 5.

Figure 8H:
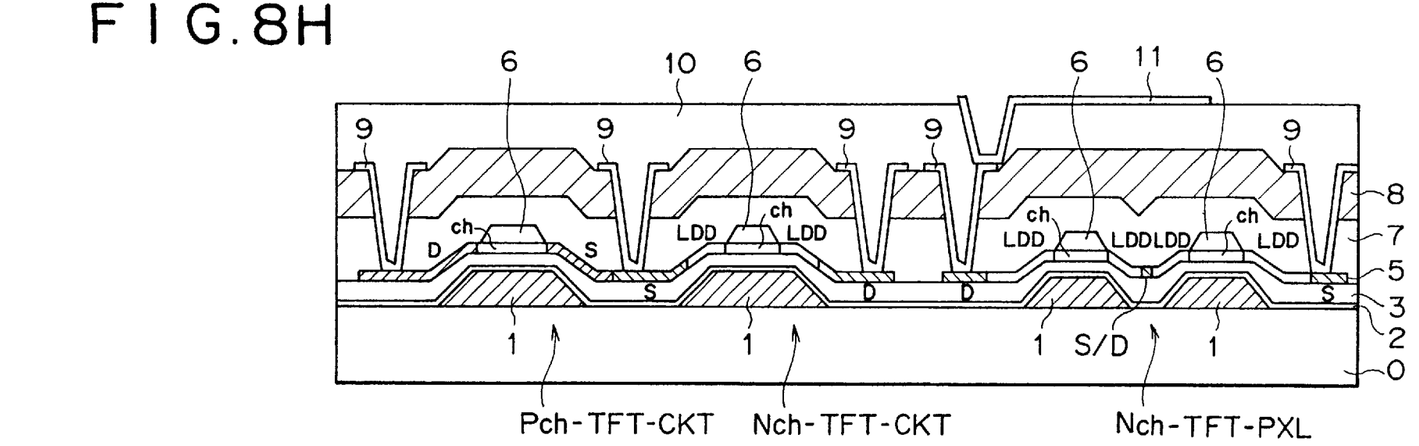

In the final step shown in FIG. 8H, contact holes are made in the interlayer insulating film 7 and the protective film 8. Wiring electrodes 9 are formed by sputtering with aluminum. A planarizing film 10 is formed by coating with acrylic organic resin or SOG. A contact hole is made in the planarizing film 10. On the contact hole is formed a transparent conductive film of ITO or IXO, which is subsequently patterned to form the pixel electrode 11. After the above-mentioned steps, there is obtained the thin-film semiconductor device consisting of an n-channel thin-film transistor for pixels (Nch-TFT-PXL) and thin-film transistors for circuits (Nch-TFT-CKT and Pch-TFT-CKT).

Figure 9:
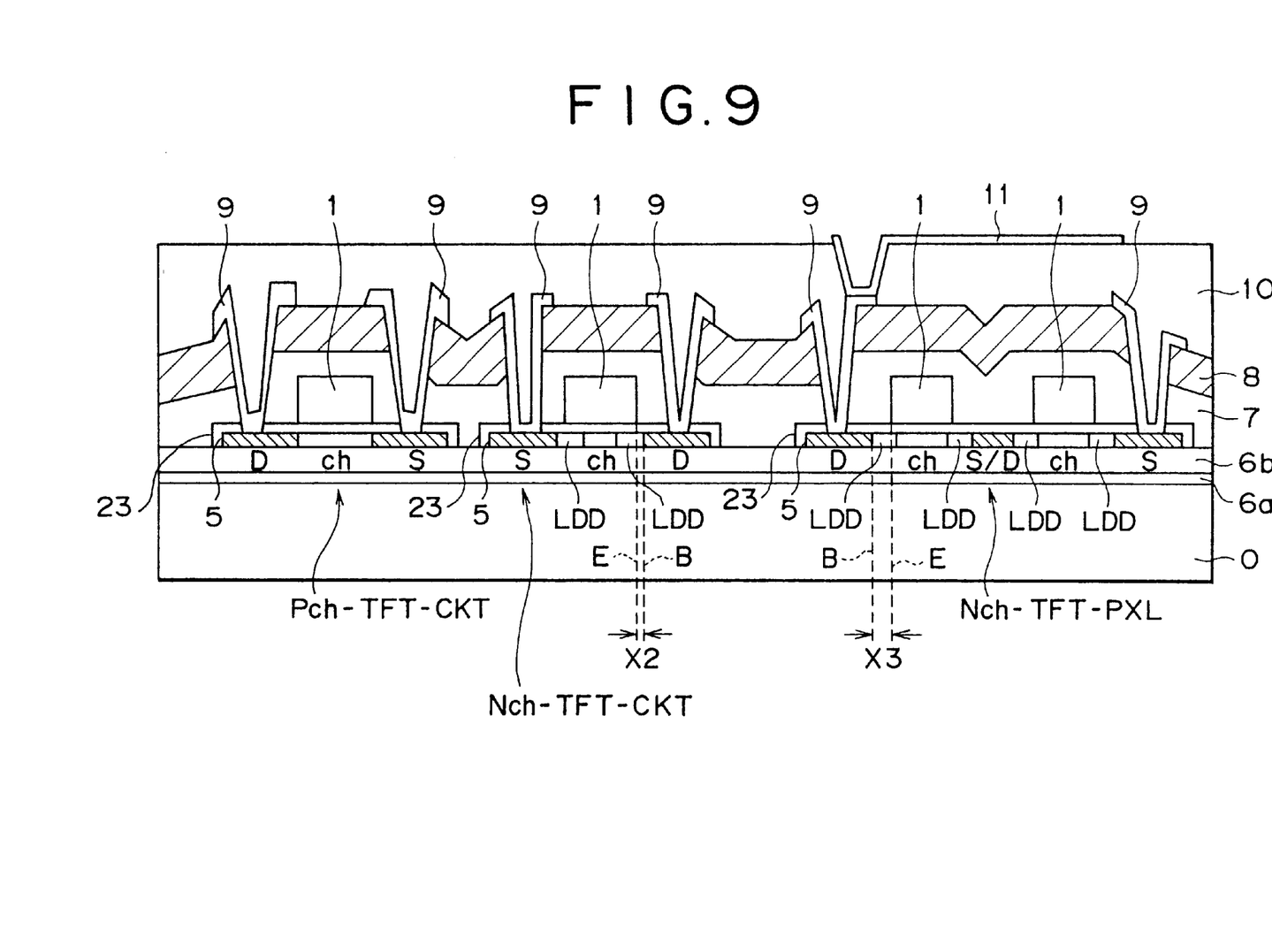
FIG. 9 is a partial sectional view showing the fourth embodiment.

FIG. 9 is a schematic partial sectional view showing the fourth embodiment of the thin-film semiconductor device pertaining to the present invention. The reference numerals in FIG. 1 are used in FIG. 9 for corresponding parts. This embodiment is not that of bottom gate structure but that of top gate structure. It has an underlying nitride film 6a and an oxide film 6b formed on an insulating substrate 0. On the oxide film 6b is formed a semiconductor thin film 5 of polycrystalline silicon, which is patterned in conformity with the region of each TFT. The region is covered with the gate insulating film 23, and the gate electrode 1 is formed thereon. In this embodiment, too, the n-channel thin-film transistor for circuits (Nch-TFT-CKT) differs from the n-channel thin-film transistor for pixels (Nch-TFT-PXL) in that the distance X2 from the LDD end of the former is shorter than the distance X3 from the LDD end of the latter. In other words, X2<X3. This means that the on-state current increases in the thin-film transistor for circuits and the leakage current decreases in the thin-film transistor for pixels.

Figure 10:
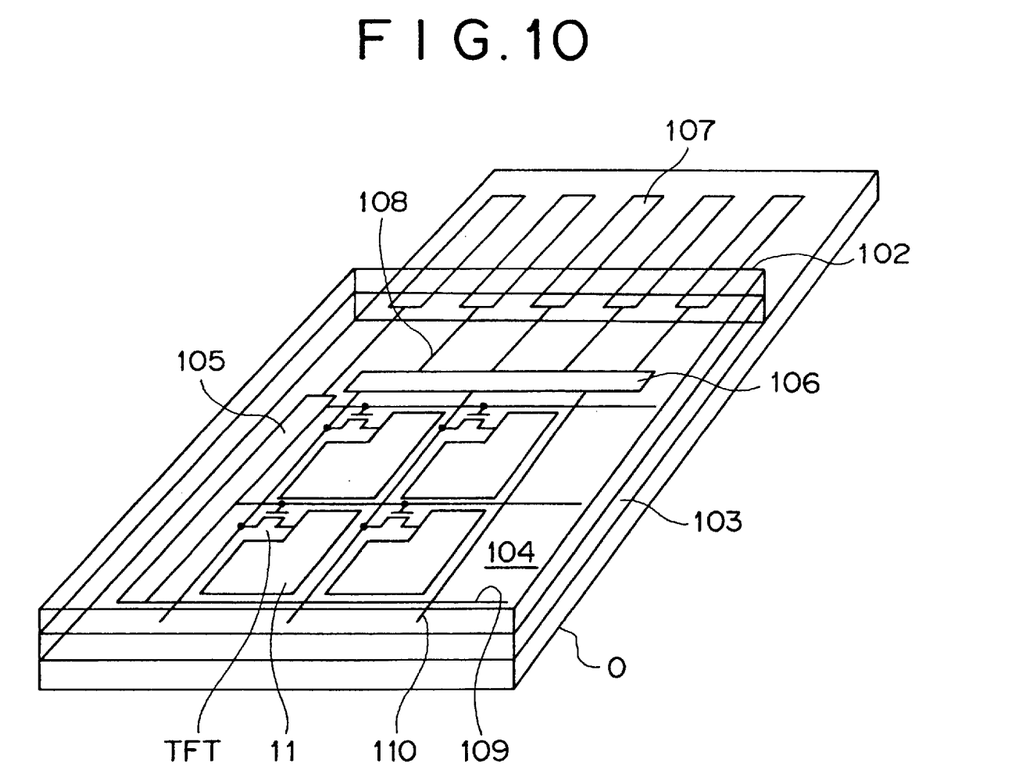
FIG. 10 is a schematic perspective view showing one example of the liquid-crystal display unit according to the present invention.

FIG. 10 is a schematic perspective view showing one example of the liquid crystal display unit of active matrix type which is driven by the thin-film semiconductor device according to the present invention. The liquid crystal display unit has the panel structure consisting of a pair of insulating substrates 0 and 102 and an electro-optical substance 103 held between them. The electro-optical substance 103 is a liquid crystal material. On the lower substrate 0 are formed by integration the pixel array section 104 and the peripheral circuit section. The peripheral circuit section is divided into the vertical driving circuit 105 and the horizontal driving circuit 106. The pixel array section 104 has gate wirings 109 forming the row and signal wirings 110 forming the column. At each intersection of the two wirings are formed a pixel electrode 11 and a thin-film transistor TFT to drive the pixel electrode 11. The thin-film transistor TFT has its gate electrode connected to the corresponding gate wiring 109, has its drain region connected to the corresponding pixel electrode 11, and has its source region connected to the corresponding signal wiring 110. The gate wiring 109 is connected to the vertical driving circuit 105, and the signal wiring 110 is connected to the horizontal driving circuit 106. The optimum LDD length according to the present invention has an important place in the thin-film transistor to switch the pixel electrode 11 and the thin-film transistors contained in the vertical driving circuit 105 and the horizontal driving circuit 106.

As mentioned above, the present invention permits one to easily realize the thin-film transistor for peripheral driving circuits which keeps the on-state current high and the thin-film transistor for pixels which keeps the leakage current low. Moreover, the present invention makes it possible to integrate on the same substrate thin-film transistors for the peripheral circuit section which can be driven at a low voltage and thin-film transistors for pixels which have a low leakage current. Such thin-film transistors are useful for high-quality liquid crystal display units with low power consumption. In other words, the present invention contributes to the power saving of liquid crystal display units. The present invention also greatly contributes to the so-called system display provided with integration of high-functional circuits.

What is claimed is:

1. A thin-film semiconductor device comprising:

a pixel array section having pixel electrodes and multi-gate-type thin-film transistors for pixels which switch the pixel electrodes; and a peripheral circuit section arranged around the pixel array section, said peripheral circuit section having driving circuits each having single-gate-type thin-film transistors for circuits which drive the thin-film transistors for pixels, said thin-film transistors each having a laminate structure having a semiconductor thin film, a gate electrode, and a gate insulating film interposed between them, and said semiconductor thin film having a channel region inside the end of the gate electrode, a lightly doped region outside said channel region, a heavily doped region outside said lightly doped region, and a concentration boundary which separates said lightly doped region and said heavily doped region from each other, wherein said concentration boundary measured from an end of said gate electrode is positioned more inside in said single-gate-type thin-film transistors for circuits than in said multi-gate-type thin-film transistors for pixels, wherein the concentration boundary of the thin-film transistors for circuits is positioned outside as much as a first distance from the end of the gate electrode and the concentration boundary of the thin-film transistors for pixels is positioned outside as much as a second distance from the end of the gate electrode, with the first distance being shorter than the second distance, and wherein each thin-film transistor has the laminate structure of a bottom gate type in which the semiconductor thin film is placed on the gate electrode with a gate insulating film interposed between them.

2. A thin-film semiconductor device as defined in claim 1, wherein the thin-film transistor for circuits has a lightly doped region at the drain side but does not have a lightly doped region at the source side.

3. A liquid crystal display unit comprising:

a pair of substrates joined together with a prescribed space held between them and having a liquid crystal material held in said space, one of the substrates having a pixel array section and a peripheral circuit section arranged around said pixel array section and the other of the substrates having electrodes facing said pixel array section, said pixel array section having pixel electrodes and multi-gate-type thin-film transistors for pixels to switch the pixel electrodes, said peripheral circuit section having driving circuits each having single-gate-type thin-film transistors for circuits to drive the thin-film transistors for pixels, wherein said thin-film transistors each have a laminate structure having a semiconductor thin film, a gate electrode, and a gate insulating film interposed between them, and said semiconductor thin film has a channel region inside an end of the gate electrode, a lightly doped region outside said channel region, a heavily doped region outside said lightly doped region, and a concentration boundary which separates said lightly doped region and said heavily doped region from each other, said concentration boundary measured from the end of said gate electrode being positioned more inside in said single-gate-type thin-film transistors for circuits than in said multi-gate-type thin-film transistors for pixels, wherein the concentration boundary of the thin-film transistors for circuits is positioned outside as much as a first distance from the end of the gate electrode and the concentration boundary of the thin-film transistors for pixels is positioned outside as much as a second distance from the end of the gate electrode, with the first distance being shorter than the second distance, and wherein each thin-film transistor has the laminate structure of a bottom gate type in which the semiconductor thin film is placed on the gate electrode with a gate insulating film interposed between them.

4. A liquid crystal display unit as defined in claim 3, wherein the thin-film transistor for circuits has a lightly doped region at the drain side but does not have a lightly doped region at the source side.

5. A process for producing a thin-film semiconductor device having a pixel array section having pixel electrodes and multi-gate-type thin-film transistors for pixels which switch the pixel electrodes, and a peripheral circuit section arranged around the pixel array section, said peripheral circuit section having driving circuits each having single-gate-type thin-film transistors for circuits which drive the thin-film transistors for pixels, said process comprising:

forming each of said thin-film transistor by lamination of a semiconductor thin film, a gate electrode, and a gate insulating film interposed between them, forming said semiconductor thin film such that it has a channel region inside the end of the gate electrode, a lightly doped region outside said channel region, a heavily doped region outside said lightly doped region, and a concentration boundary which separates said lightly doped region and said heavily doped region from each other, said concentration boundary measured from an end of said gate electrode being positioned more inside in said single-gate-type thin-film transistors for circuits than in said multi-gate-type thin-film transistors for pixels, wherein the concentration boundary of the thin-film transistors for circuits is positioned outside as much as a first distance from the end of the gate electrode and the concentration boundary of the thin-film transistors for pixels is positioned outside as much as a second distance from the end of the gate electrode, with the first distance being shorter than the second distance, and wherein each of the thin-film transistors is formed in a bottom gate type in which the semiconductor thin film is placed on the gate electrode with a gate insulating film interposed between them.

6. A process for producing a thin-film semiconductor device as defined in claim 5, wherein the thin-film transistor for circuits has a lightly doped region formed at the drain side but does not have a lightly doped region formed at the source side.

7. A process for producing a liquid crystal display unit having a pair of substrates joined together with a prescribed space held between them and having a liquid crystal material held in said space, one of the substrates having a pixel array section and a peripheral circuit section arranged around said pixel array section and the other of the substrates having electrodes facing said pixel array section, said pixel array section having pixel electrodes and multi-gate-type thin-film transistors for pixels to switch the pixel electrodes, said peripheral circuit section having driving circuits each having single-gate-type thin-film transistors for circuits to drive the thin-film transistors for pixels, said process comprising:

forming each thin-film transistor by lamination of a semiconductor thin film, a gate electrode, and a gate insulating film interposed between them, said semiconductor thin film has a channel region formed inside an end of the gate electrode, a lightly doped region outside said channel region, a heavily doped region outside said lightly doped region, and a concentration boundary formed so as to separate said lightly doped region and said heavily doped region from each other, said concentration boundary measured from the end of said gate electrode being formed more inside in said single-gate-type thin-film transistors for circuits than in said multi-gate-type thin-film transistors for pixels, wherein the concentration boundary of the thin-film transistors for circuits is positioned outside as much as a first distance from the end of the gate electrode and the concentration boundary of the thin-film transistors for pixels is positioned outside as much as a second distance from the end of the gate electrode, with the first distance being shorter than the second distance, and wherein each thin-film transistor is formed in a bottom gate type in which the semiconductor thin film is placed on the gate electrode with a gate insulating film interposed between them.

8. A process for producing a liquid crystal display unit as defined in claim 7, wherein the thin-film transistor for circuits has a lightly doped region formed at the drain side but does not have a lightly doped region formed at the source side.

* * * * *